United States Patent [19]
Fujii et al.

[11] Patent Number: 5,313,078
[45] Date of Patent: May 17, 1994

[54] MULTI-LAYER SILICON CARBIDE LIGHT EMITTING DIODE HAVING A PN JUNCTION

[75] Inventors: Yoshihisa Fujii; Hajime Saito; Akira Suzuki, all of Nara, Japan

[73] Assignee: Sharp Kabushiki Kaisha, Osaka, Japan

[21] Appl. No.: 984,984

[22] Filed: Dec. 2, 1992

[30] Foreign Application Priority Data

Dec. 4, 1991 [JP] Japan ................. 3-320228
May 1, 1992 [JP] Japan ................. 4-112628
May 26, 1992 [JP] Japan ................. 4-133986

[51] Int. Cl.$^5$ ........................... H01L 33/00
[52] U.S. Cl. ........................ 257/77; 257/101; 257/102; 257/103
[58] Field of Search ............. 257/77, 89, 101, 103, 257/102, 628

[56] References Cited

U.S. PATENT DOCUMENTS

| | | | |
|---|---|---|---|
| 3,972,749 | 8/1976 | Pavlichenko | 257/77 |
| 3,986,193 | 10/1976 | Vodakov et al. | 257/77 |
| 4,918,497 | 4/1990 | Edmond | 257/77 |
| 5,027,168 | 6/1991 | Edmond | 257/77 |
| 5,061,972 | 10/1991 | Edmond | 257/77 |
| 5,063,421 | 11/1991 | Suzuki et al. | 257/77 |

FOREIGN PATENT DOCUMENTS

| | | | |
|---|---|---|---|
| 60-136223 | 7/1985 | Japan | 257/77 |
| 60-150621 | 8/1985 | Japan | 257/77 |
| 2-290084 | 11/1990 | Japan | 257/77 |
| 3-97275 | 4/1991 | Japan | 257/77 |
| 4-25184 | 1/1992 | Japan | 257/77 |

OTHER PUBLICATIONS

Ikeda et al., "Fabrication of 6H-SiC light-emitting diodes by a rotation dipping technique: electroluminescence mechanisms" *J. Appl. Phys.* (1979) 50(12):8215-8225.

Primary Examiner—Rolf Hille
Assistant Examiner—Minhloan Tran
Attorney, Agent, or Firm—Morrison & Foerster

[57] ABSTRACT

This invention is a multi-layer pn type silicon carbide light emitting diode. A first n-type silicon carbide layer is deposited on an n-type substrate. The first n-type silicon carbide layer has an electron concentration larger than $1 \times 10^{15}$ cm$^{-3}$ and smaller than the electron concentration of the substrate and has a thickness of between 0.1 to 20 μm. A second n-type silicon carbide layer is disposed over the first n-type layer. A first p-type silicon carbide layer is disposed on the second n-type layer to form a PN junction layer.

22 Claims, 9 Drawing Sheets

MULTI-LAYER SILICON CARBIDE LIGHT EMITTING DIODE HAVING A PN JUNCTION

BACKGROUND OF THE INVENTION

1. Field of the Invention

This invention relates to a structure of a pn junction type light emitting diode using SiC, and more particularly to a blue light emitting diode with a high luminance.

2. Prior Art

Light emitting diodes, which constitute a small light source that can provide a stable and high electroluminescence by consuming only a small amount of power, can be adopted as a light source for reading information records that can be used in each kind of a display device. Visible light emitting diodes so far widely produced for practical use can emit visible light with high luminance ranging from red to green light. Compared with such light emitting diodes, blue light emitting diode is still low in luminance and are not widely produced for practical use.

In general, the color of light emitted from a light emitting diode depends on the semiconductor material therefor. Semiconductor materials to be used for light emitting diodes capable of emitting visible light with a short wavelength are limited to silicon carbide (SiC) which is a IV—IV group compound semiconductor, gallium nitride (GaN) which is a III-V group compound semiconductor, and zinc sulfide (ZnS) and zinc selenide (ZnSe) which are II-IV group compound semiconductors. With the use of these semiconductor materials, extensive research has been conducted in order to develop light emitting diodes capable of emitting visible light with a short wavelength. However, mass production of such light emitting diodes with brightness and stability sufficient for practical use has not been realized.

For the structure of light emitting diodes, a pn junction structure is most suited because electrons and holes as carriers can be injected in a light emitting region with high efficiency. However, among the above-mentioned semiconductor materials for light emitting diodes capable of emitting visible light with a short wavelength, it is impossible to use any of GaN, ZnS and ZnSe semiconductors for the production of pn junction light emitting diodes. This is because it is difficult to obtain p-type crystals from these semiconductor materials, or even if these crystals are obtained, they high resistance and are very unstable. Therefore, a metal-insulator-semiconductor (MIS) structure using a thin insulating layer or high resistive layer as an insulator has been employed instead of a pn junction structure. However, light emitting diodes with such an MIS structure have the disadvantages of having non-uniform device characteristics and of providing unstable light emission.

On the other hand, it is possible to use silicon carbide as a material for light emitting diodes of the pn junction type, because both p-type crystals and n-type crystals can readily be obtained. Many reports have already be made on blue light emitting diodes of the pn junction type using silicon carbide grown by liquid phase epitaxy (LPE). (See e.g., M. Ikeda, T, Hayakawa, S. Yamagiwa, H. Matsumani, and T. Tanaka, Journal of Applied Physics, Vol. 50, No. 12, pp. 8215–8225, 1979).

However, conventional blue light emitting diodes produced by liquid phase epitaxy, as described above, can only provide light emission with a brightness of 15 mcd or lower under the operation condition of 20 mA. The principal cause for this low brightness is considered to be as follows. The growth temperature is as high as 1700° C. to 1800° C., so that the crystal growth of silicon carbide takes place in active molten silicon, thereby making it difficult to accurately control the crystal growth, and also having a great possibility that unnecessary impurities will enter the growing crystals. Furthermore, there is the disadvantage that the use of liquid phase epitaxy cannot allow the mass production of blue light emitting diodes.

Under these circumstances, inventors of this invention has recently invented a method using the chemical vapor deposition (CVD) process for manufacturing in large quantity pn junction type light emitting diodes that can emit high luminance blue visible light with good controllability. (Refer to Japanese Laid-Open Patent No. 129918/1989.)

Since semiconductors using SiC is of indirect transition type, it is particularly important to reduce the disappearance ratio of injected carriers through the non-radiative recombination process to embody a high luminance blue light emitting diode using SiC. The non-radiative recombination process results from the lattice defects at the SiC pn junction portion forming a pn junction and incomplete crystallinity caused by, for example, impurities. It is important to form a good-quality SiC layer.

As shown in FIG. 15, conventional counterparts of blue light emitting diodes using SiC can be manufactured by sequentially forming a n-type SiC layer 240 and a p-type SiC layer 350 on a n-type substrate 12 with favorable light transmittance. Reference numerals 60 and 70 in FIG. 15 designate an electrode. The n-type SiC substrate needs to be low in resistance, because pn junction type diodes have a serial resistance. The substrate exhibits a resistivity of 1 Ω·cm or less and electron concentration of $1 \times 10^{17}$ cm$^{-3}$ or more.

Many lattice defects involved in impurity-doped SiC single-crystal substrate for providing a low resistance inevitably results in exhibiting the same lattice defects in a pn junction grown layer overlaying the same substrate, which causes a non-luminescent recombination process, thereby inhibiting the embodiment of a high luminance blue light emitting diode such that it can be widely produced for practical use.

SUMMARY OF THE INVENTION

It is an object of this invention to provide a pn junction type light emitting diode that can emit blue light with a high luminance to overcome the above drawbacks.

The invention provides a pn junction type SiC light-emitting diode comprising:
- a n-type SiC single-crystal substrate provided with an ohmic electrode on the rear surface thereof;
- a first n-type SiC single-crystal layer overlaying said substrate;
- a second n-type SiC single-crystal layer overlaying said first n-type SiC single-crystal layer; and
- a first p-type SiC single-crystal layer overlaying said second n-type layer;
- said second n-type SiC single-crystal layer and said first p-type SiC being combined to form a pn junction layer;
- said first n-type SiC single-crystal layer having an electron concentration larger than $1 \times 10^{15}$ cm$^{-3}$ and smaller than an electron concentration of said substrate and having a thickness of 0.1 to 20 μm.

BRIEF DESCRIPTION OF THE DRAWINGS

The invention is further detailed with respect to the drawings in which.

DETAILED DESCRIPTION OF THE INVENTION

The pn junction type SiC light emitting diode according to the invention can be provided by forming between a n-type SiC single-crystal substrate and a pn junction layer for electroluminescence a first n-type SiC single-crystal layer whose electron concentration is smaller than that of the substrate. Such a construction enables the formation of a good-quality SiC pn junction grown layer free from lattice defects produced in the substrate to provide a high luminance blue light emitting diode. The electron concentration increases along with an increase in the impurity concentration.

The first n-type layer preferably exhibits an electron concentration of $1 \times 10^{15}$ cm$^{-3}$ to $1 \times 10^{17}$ cm$^{-3}$, preferably $5 \times 10^{15}$ to $5 \times 10^{16}$ cm$^{-3}$. It has a thickness of 1 to 20 μm, preferably 1 to 10 μm.

The n-type SiC single-crystal substrate according to the invention is of a hexagonal polytype selected from the group comprising a 6H-type, a 15R-type and a 4H-type. Among them, the 6H-type is particularly preferable. The n-type SiC single-crystal substrate usually has an electron concentration of $1 \times 10^{17}$ cm$^{-3}$ or more, preferably $1 \times 10^{17}$ cm$^{1-3}$ to $5 \times 10^{17}$ cm$^{-3}$.

The inventors of this invention has found that the CVD method allows the growth of thin film of SiC single-crystal layers with only a small amount of impurities on the SiC substrate, thereby interrupting possible defects of crystallinity in the SiC substrate and providing the formation of good pn junction layer for electroluminescence.

The dependency of half value width of X ray diffraction indicating the crystallinity of SiC surface layers on the film thickness was examined by preparing as n-type SiC single-crystal grown layers an impurity non-doped layer with an electron concentration of $5 \times 10^{15}$ cm$^{-3}$ and a nitrogen-doped layer with an electron concentration of $1 \times 10^{18}$ cm$^{-3}$ in such a manner that the two layers have different thickness.

Figure 1:
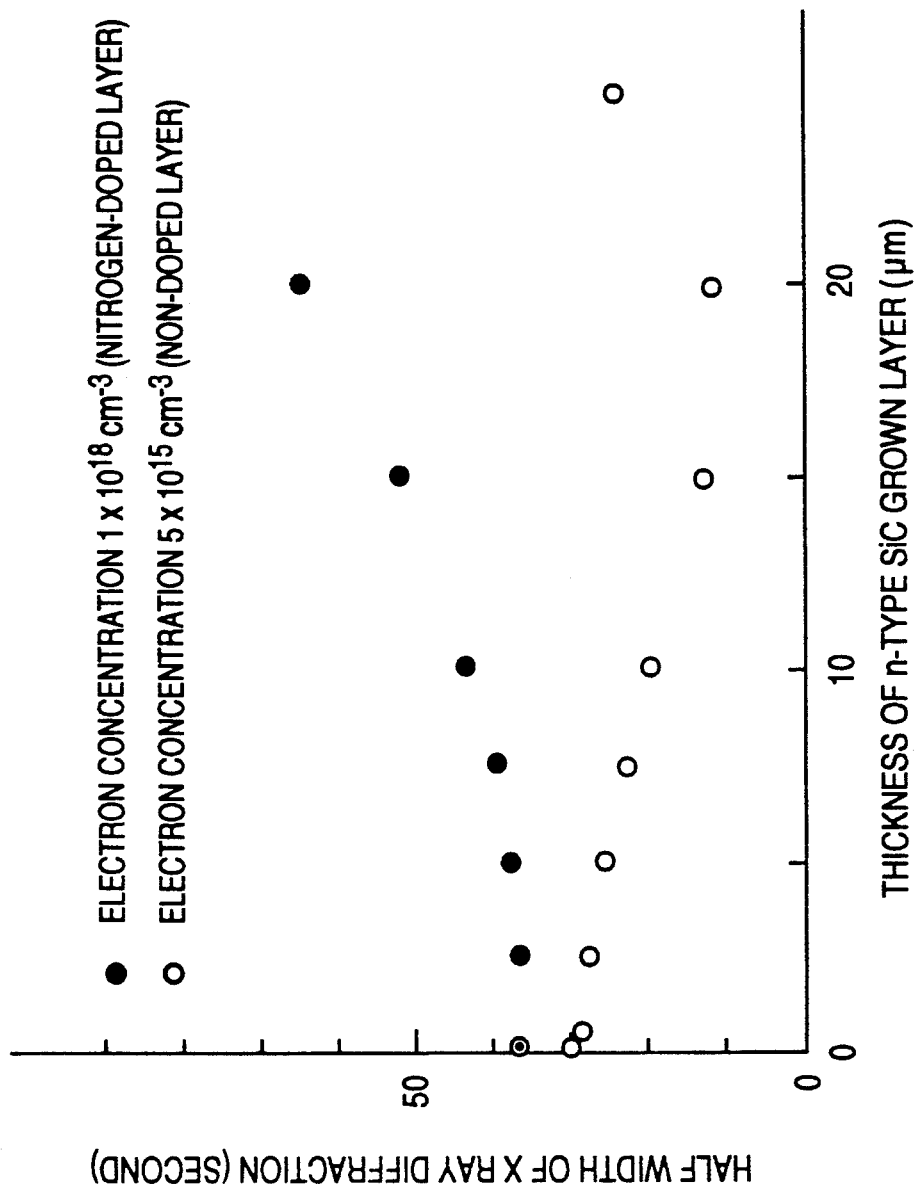
FIG. 1 is a graph showing the relation between the thickness of a n-type SiC grown layer and the crystallinity thereof (half width of the X-ray diffraction) wherein electron concentrations differ.

As shown in FIG. 1, the crystallinity does not improve and actually reduces along with the increase in the thickness of the grown layer in the case of nitrogen-doped layers (shown by a symbol ●). Compared with this, the non-doped layer (shown by a symbol ○) provide crystallinity favorable than the substrate along with the increase in the film thickness.

In this way, it has been found that thin film growth with the CVD method provides a SiC grown layer with only a small amount of impurities, and that use of this grown layer provides more perfect single-crystals with less defects than substrate crystals along with an increase in the film thickness.

Thus, the first n-type SiC single-crystal layer and the pn junction layer are formed with the CVD method in the invention.

According to the invention, a pn junction layer is disposed on the first n-type SiC single-crystal layer.

The pn junction layer consists of a second n-type SiC single-crystal layer and a first p-type SiC single-crystal layer.

The second n-type SiC single-crystal layer is usually formed under the same condition with the first n-type SiC single-crystal layer, but the first n-type SiC single-crystal layer may serve as the second n-type layer.

The second n-type SiC single-crystal layer may not contain an acceptor, but preferably contain it. The concentration of the acceptor usually ranges from $1 \times 10^{17}$ to $5 \times 10^{19}$ cm$^{-3}$, but preferably be $1 \times 10^{18}$ to $2 \times 10^{19}$ cm$^{-3}$.

The acceptor is preferably formed of aluminum or gallium.

On the other hand, the second n-type SiC single-crystal layer preferably contains a nitrogen donor. The concentration of the nitrogen donor usually ranges from $2 \times 10^{17}$ to $1 \times 10^{20}$ cm$^{-3}$, but preferably ranges from $2 \times 10^{18}$ to $4 \times 10^{19}$ cm$^{-3}$. The nitrogen donor usually exhibits an electron concentration of $1 \times 10^{15}$ to $1 \times 10^{18}$ cm$^{-3}$, but preferably an electron concentration of $5 \times 10^{16}$ to $5 \times 10^{17}$ cm$^{-3}$.

The first p-type SiC single-crystal layer usually contains aluminum as an acceptor impurity, but may further contain nitrogen donor. The hole concentration of this p-type SiC single-crystal layer is usually in the range of $1 \times 10^{16}$ cm$^{-3}$ to $1 \times 10^{18}$ cm$^{-3}$. Adjusting the hole concentration thereof in this range allows the control of the ratio of an electric current due to hole injection from the first p-type SiC single-crystal layer to the second n-type SiC single-crystal layer to the counterpart due to the electron concentration from the first p-type SiC single-crystal layer to the second n-type SiC single-crystal layer to the first p-type SiC single-crystal layer within the scope of 0.1 to 10 preferably 0.05 to 10 when the diode is operated.

The ratio of the electron concentration ($1 \times 10^{15}$ to $1 \times 10^{18}$ cm$^{-3}$) of the second n-type SiC single-crystal layer to the hole concentration of the first p-type SiC single-crystal layer is in the range of 0.05 to 10 preferably 0.05 to 5, when the diode is operated.

This invention allows further arrangement of a second p-type SiC single-crystal layer on the pn junction layer, which single-crystal layer acts as an electric current diffusion layer forming a sufficient diffusion of current to excite the whole region of luminescent layer to such an extent that the current injected into the layer reaches the first p-type SiC single-crystal layer, thereby heightening the luminous efficiency of the diode.

Figure 4:
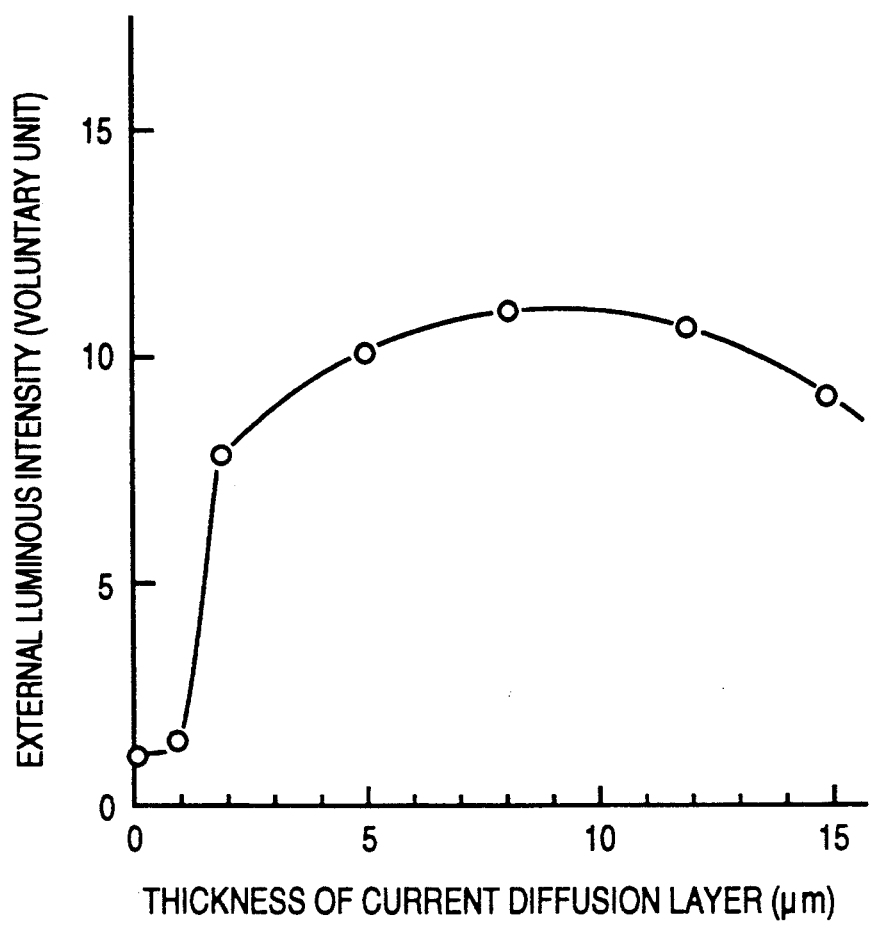
FIG. 4 is a graph showing the relation between the thickness of the electric current diffusion layer of the pn junction type light emitting diode according to the invention and external luminous intensity thereof.

The use of a substantially (0001) Si surface as the substrate thereof can prevent a substantial reduction in the crystallinity in the second p-type SiC single-crystal layer and also allows the reduction in the light absorption coefficient. As apparent from FIG. 4 containing a graph showing the relation between the thickness of the current diffusion layer and the external luminous efficiency, the thickness of the second p-type SiC single-crystal layer is usually in the range of 2 to 15 μm, preferably 2 to 6 μm.

The light emitting diode according to the invention is provided with an ohmic electrode respectively on the rear surface of the n-type SiC single-crystal substrate-crystal substrate and on the top surface of the second p-type SiC single-crystal layer to constitute a pn junction type light emitting diode. OPERATION The first n-type SiC single-crystal layer arranged on the n-type SiC single-crystal substrate with the CVD method exhibits a high crystallinity. The pn junction layer overlaying the first n-type SiC single-crystal layer also involves a high crystallinity to emit light with a high luminance.

EMBODIMENTS

A pn junction type light emitting diode according to this invention will be detailed by way of embodiments and reference embodiments.

EMBODIMENT 1

Figure 2:
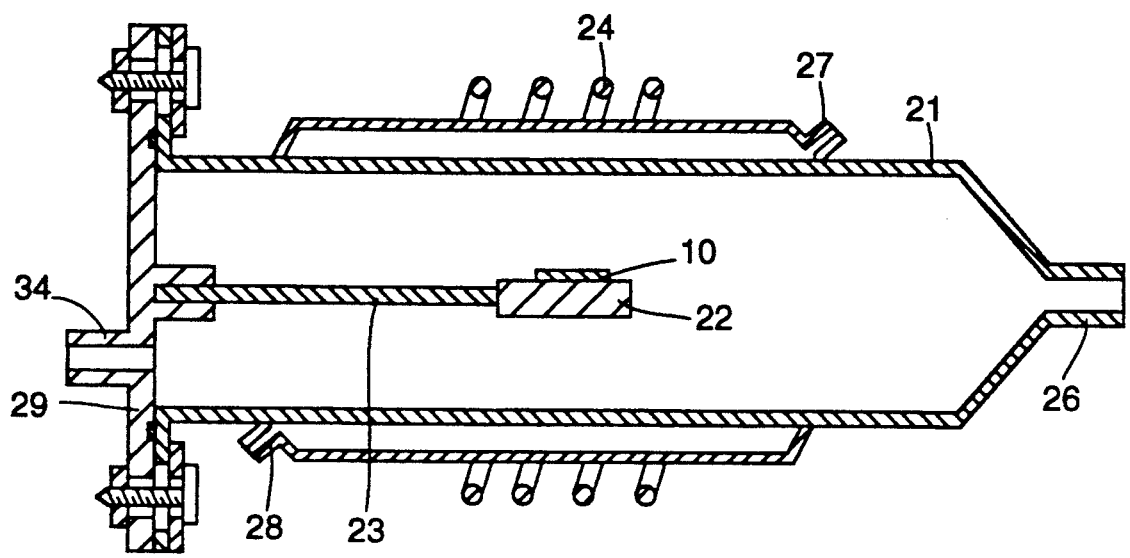
FIG. 2 is a view illustrating a CVD system for forming a SiC single-crystal layer used in an embodiment of this invention.

A pn junction type light emitting diode according to this invention was manufactured using a gas phase growth system shown in FIG. 2 in a process detailed below.

Reference numeral 21 designates a reaction tube made of quartz, 22 a sample base, 23 a support bar, 24 a work coil, 26 an inlet port of source gas, carrier gas and impurity gas, 27 and 28 an inlet port of cooled water, 29 a stain-less-made flange, and 34 a gas outlet port.

Initially, a 6H-type n-type SiC single-crystal substrate 10 (with a dimension of 1 cm × 1 cm) was placed on the sample base 22. As a growth surface of the substrate 10 was used a surface inclined by about 5 degrees from the (0001) direction toward the <1120> direction.

Figure 3:
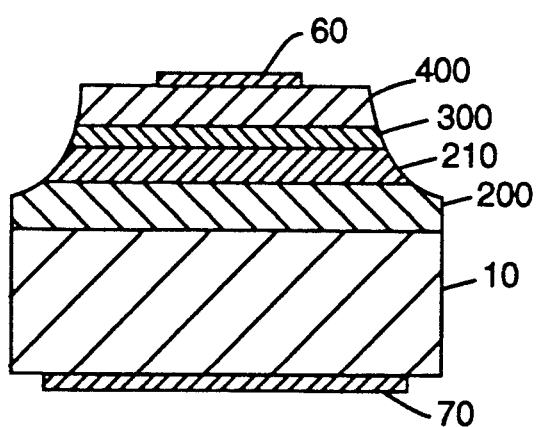
FIG. 3 is a view illustrating an embodiment of the pn junction type light emitting diode according to the invention.

Subsequently, a high frequency current was allowed to pass through the working coil and the n-type SiC single-crystal substrate 10 was heated to 1,400° to 1,500° C. while allowing hydrogen gas to flow through the gas phase growth system from the gas inlet port 26 to the reaction tube 21 as a carrier gas at a rate of $1 \times 10^4$ cc per minute. Referring to FIG. 3 adding source gas and impurity gas to the carrier gas enabled subsequent growth of a first n-type SiC single-crystal layer 200, a second n-type single-crystal layer 210, a first p-type SiC single-crystal layer 300, and a second p-type SiC single-crystal layer 400 of the electric current diffusion layer on a n-type SiC single-crystal substrate 10 to form a pn junction type light emitting diode.

In Embodiment 1, monosilane (SiH$_4$) gas and propane (C$_3$H$_8$) gas was employed as source gas. The flow rate of the source gas was set at be about 1 cc per minutes. Besides, such gas as trimethylaluminum (Al(CH$_3$)$_3$) gas was employed for doping aluminum acceptor and nitrogen (N$_2$) gas for doping nitrogen donor.

In the process of growing the first n-type SiC single-crystal layer 200, an n-type SiC layer with an electron concentration of $5 \times 10^{15}$ cm$^{-3}$ was grown without doping impurities. The thickness of the film was set at 10 μm. In the process of growing the second n-type SiC single-crystal layer 210, nitrogen gas and trimethylaluminum were simultaneously added. Adding nitrogen gas at a rate of 3 to 10 cc per minute and trimethylaluminum at a rate of 0.2 to 0.4 cc per minute yielded a n-type layer whose electron concentration was compensated with aluminum acceptor within the scope of $5 \times 10^{16}$ to $5 \times 10^{17}$ cm$^{-3}$. This layer provided a luminescent layer. It had a thickness of 3 to 4 μm. In the process of growing the first p-type SiC single-crystal layer 300 and the second p-type SiC single-crystal layer of the electric current diffusion layer, only trimethylaluminum was doped at a rate of 0.3 to 0.5 cc/m.

The thickness of the first p-type SiC single-crystal layer and the second p-type single-crystal layer was set at 1 μm and 4 μm, respectively.

After the growth process, the substrate was taken out from the reaction tube 21, followed by a selective etching of the first n-type SiC single-crystal layer 200, the second n-type SiC single-crystal layer 210, the first p-type single-crystal layer 300 and the second p-type SiC single-crystal layer 400 with a dry etching process to form a mesa construction shown in FIG. 3. This etching process provided an about 250 μm × 250 μm square pn junction portion. Such gas as carbon tetrafluoride (CF$_4$) gas and oxygen (O$_2$) gas was used as etching gas. In the last process, a Ni-made ohmic electrode 70 was formed on the rear surface of the n-type SiC single-crystal substrate 10 and a p-type ohmic electrode 60 comprising a laminated layer of Ti and Al, thereby affording a pn junction type light emitting diode shown in FIG. 3.

Applying an operating voltage of about 3.2 V to the light emitting diode thus given allowed current to pass through the device at 20 mA to give blue light electroluminescence with a peak wavelength of 465 mm.

As a comparative example of the invention, a pn junction type light emitting diode was manufactured in the same manner with the embodiment except for the absence of the process of inserting a non-doped n-type SiC single-crystal layer (the first n-type SiC single-crystal layer 200).

The pn junction type light emitting diode of the invention exhibited an improvement in the internal luminous efficiency by two times compared with the comparative example, which generated light output about two times stronger than the comparative example.

EMBODIMENT 2

Embodiment 2 of the pn junction type light emitting diode was manufactured in the same manner as example 1 except that a n-type SiC layer doped with nitrogen gas at a rate of 3 to 10 cc/m and trimethylaluminum at a rate of 0.2 to 0.4 cc/m and having an electron concentration of $5 \times 10^{17}$ to $5 \times 10^{18}$ cm$^{-3}$ was provided in the process of growing a second n-type SiC single-crystal layer while a p-type SiC layer doped with nitrogen gas at a rate of 0.1 cc and 0.3 cc and trimethylaluminum at a rate of 0.3 to 0.45 cc of trimethylaluminum and compensated with nitrogen donor with a hole concentration of and $5 \times 10^{15}$ cm$^{-3}$ to $5 \times 10^{18}$ cm$^{-3}$ was provided in the process of growing the first p-type SiC single-crystal layer. In Embodiment 2, the second n-type SiC layer and the first p-type SiC layer provided a luminescent layer. The ratio of the electron concentration of the second n-type SiC single-crystal layer to the hole concentration of the first p-type SiC single-crystal layer ranges within 10 to 0.05.

Applying an operating voltage of about 3.2 V to the light emitting diode thus given allowed current to pass through the device at 20 mA and provided a blue light electroluminescence with a peak wavelength of 465 nm.

As a comparative example, a pn junction type light emitting diode was manufactured in the same manner with example 2 except for the absence of the process of inserting a non-doped n-type SiC single-crystal layer (the first n-type SiC single-crystal layer 200). The light emitting diode of the invention generated light output two times stronger than the comparative example.

EMBODIMENT 3

Figure 5:
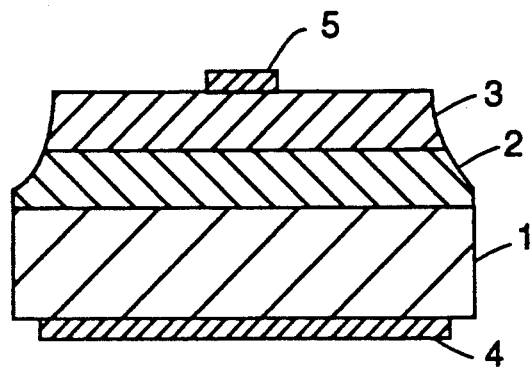
FIG. 5 is a view illustrating another embodiment of the pn junction type light emitting diode manufactured according to the invention.

Referring to FIG. 5, Embodiment 3 of the on junction type comprises a n-type SiC single-crystal substrate 1, a n-type SiC single-crystal layer 2 (with a thickness of 2 μm) overlaying the substrate, a p-type SiC single-crystal layer 3 (with a thickness of 62 μm) formed adjacent the n-type SiC single-crystal layer 2. A pn junction is formed between the n-type SiC single-crystal layer 2 and the p-type SiC single-crystal layer 3. The n-type SiC single-crystal layer 2 and the p-type SiC single-crystal layer 3 constitute a mesa construction. On the rear surface of the n-type SiC single-crystal layer, a Ni-made ohmic electrode 4 was formed while on the p-type SiC single-crystal layer an ohmic contact electrode 5 was formed.

The n-type SiC single-crystal layer 2 contained aluminum as an acceptor impurity and nitrogen as a donor impurity. The electron concentration of the n-type SiC single-crystal layer 2 was obtained by subtracting the hole concentration at which only aluminum was doped from the electron concentration at which only nitrogen was doped. The n-type SiC single-crystal layer 2 had an electron concentration of $5 \times 10^{16}$ cm$^{-3}$.

The p-type SiC single-crystal layer 3 contained aluminum as an acceptor impurity. The p-type SiC single-crystal layer had an hole concentration of $1 \times 10^{17}$ cm$^{-3}$. It had preferably an hole concentration of $1 \times 10^{16}$ to $1 \times 10^{18}$ cm$^{-3}$. Adjusting the hole concentration in the p-type SiC monocrystal layer 3 within the scope of $1 \times 10^{16}$ to $1 \times 10^{18}$ allows the control of the ratio of current induced by electrons injected from the n-type SiC single-crystal layer 2 to the p-type SiC single-crystal layer 3 to the current induced by holes injected from the p-type SiC single-crystal layer 3 to the n-type SiC single-crystal layer 2 within the scope ranging from 0.1 to 10.

The ratio of the electron concentration ($5 \times 10^{16}$) of the n-type SiC single-crystal layer 2 to the hole concentration ($1 \times 10^{17}$ cm$^{-3}$) of the p-type SiC single-crystal layer exhibited 0.5.

As mentioned above, adjusting the hole concentration within the scope of $1 \times 10^{16}$ to $1 \times 10^{18}$ cm$^{-3}$ allows the control of the ratio of the electron concentration ($5 \times 10^{16}$ cm$^{-3}$) in the n-type SiC single-crystal layer 2 to the hole concentration in the p-type SiC single-crystal layer within the scope ranging from 0.05 to 5.

In Embodiment 3, aluminum is doped as an acceptor impurity while nitrogen was doped as a donor impurity. Besides, the n-type SiC single-crystal substrate 1, the n-type SiC single-crystal layer 2 and the p-type SiC single-crystal layer 3 had a 6H-type crystal construction (the energy band gap The pn junction light emitting diode was manufactured using a gas phase growth system in the following way as shown in FIG. 2. The temperature of the n-type SiC single-crystal substrate was allowed to rise to 1400° to 1500° C. Hydrogen gas was allowed to flow at a rate of 10 liters per minute as a carrier gas.

Addition of source gas and impurity gas to the carrier gas promoted the growth of the n-type SiC single-crystal layer 2 on the SiC single-crystal substrate 1. As source gas 1 cc/m of monosilane (SiH$_4$) gas was and 1 cc/m of propane (C$_3$H$_8$) gas was used. As impurity gas, 0.1 cc/m of trimethylaluminum (Al(CH$_3$)$_3$) gas was used for doping aluminum acceptor and 0.45 cc/m of nitrogen gas for doping nitrogen donor.

Besides, while allowing carrier gas, source gas and impurity gas to flow, the p-type SiC single-crystal layer 3 was grown on the n-type SiC single-crystal layer 2. As source gas, 1 cc/m of monosilane (SiH$_4$) gas and 1 cc/m of propane (C$_3$H$_8$) gas was used. As impurity gas, 0.03 to 0.3 cc/m of trimethylaluminum (Al(CH$_3$)$_3$) gas was used for doping aluminum acceptor.

After taking out this n-type SiC single-crystal substrate 1 from the gas phase growth system, the n-type SiC single-crystal layer 2 and the p-type SiC single-crystal layer 3 were selectively etched with dry etching process by allowing etching gas to flow so that the pn junction would form an about 250×250 μm square. As a result of this etching process, the n-type SiC single-crystal substrate 1 having the n-type SiC single-crystal layer 2 and the p-type single-crystal layer 3 adjacent the n-type SiC single-crystal layer was given. Consequently, a mesa construction comprising the n-type SiC single-crystal layer 2 and the p-type SiC single-crystal layer 3 was given. As etching gas such gas as carbon tetrafluoride (CF$_4$) gas and oxygen (O$_2$) gas was used.

On the rear surface of the n-type SiC single-crystal substrate 1, a Ni-made ohmic electrode 4 was formed. In the next process, an ohmic electrode 5 comprising a laminated layer of Ti and Al was formed on the p-type SiC single-crystal layer 3.

Subsequently, adjusting the value obtained by subtracting the hole concentration in the n-type SiC single-crystal layer 2 from the electron concentration in the same n-type SiC single-crystal layer 2 to the scope of $5 \times 10^{16}$ cm$^{-3}$ and adjusting the hole concentration in the p-type SiC single-crystal layer 3 to $1 \times 10^{17}$ cm$^{-3}$ allowed a ratio of the current induced by electrons injected from the n-type SiC single-crystal layer 2 to the p-type SiC single-crystal layer 3 to the current induced by holes injected from the p-type SiC single-crystal layer 3 to the n-type SiC single-crystal layer 2 in operating the diode device to give a value of 1.

Subsequently, applying an operation voltage of 3.2 V to the pn junction type light emitting diode using SiC allowed electric current to flow at 20 mA to generate blue electroluminescence with a peak wavelength of 465 nm and luminance of 15 mcd.

In Embodiment 3, the ratio of the electron concentration in the n-type SiC single-crystal layer 2 to the hole concentration in the p-type SiC single-crystal layer 3 was adjusted to a value of 0.5. However, as mentioned above, adjusting the ratio of the current induced by the electrons injected from the n-type SiC single-crystal layer 2 to the p-type SiC single-crystal layer 3 to the counterpart induced by the holes injected from the p-type SiC single-crystal layer 3 to the n-type SiC single-crystal layer 2 within the scope of 0.05 to 5 allows the control of the ratio of the current induced by the electrons injected from the n-type SiC single-crystal layer 2 to the p-type SiC single-crystal layer 3 to the counterpart induced by the holes injected from the p-type SiC single-crystal layer 3 to the n-type SiC single-crystal layer 2 within the scope of 0.1 to 10 in operating the device.

Figure 7:
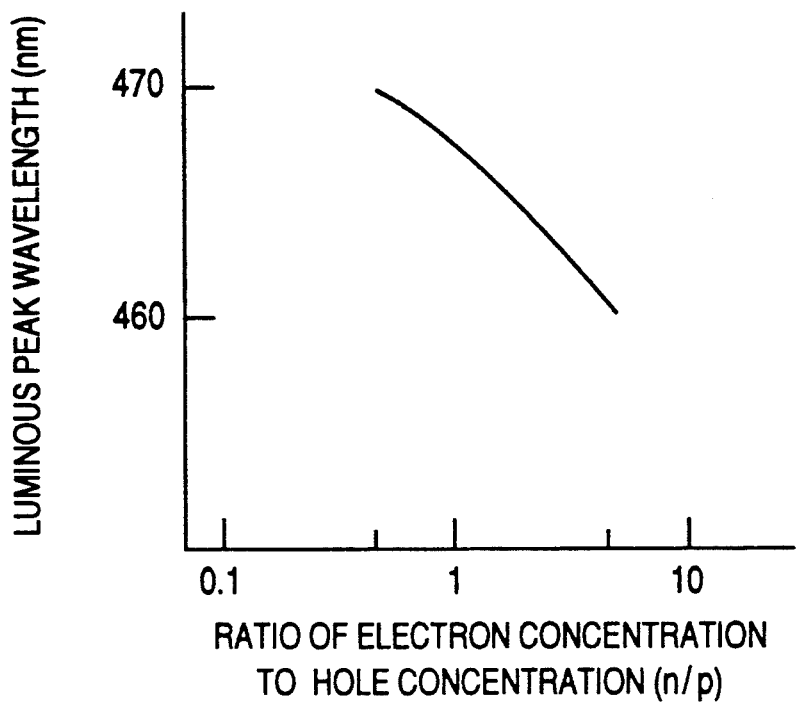
FIG. 7 is a graph illustrating the relation between the ratio of electron concentration to hole concentration in the pn junction type light emitting diode according to the invention and the wavelength of luminous peak.
Figure 8:
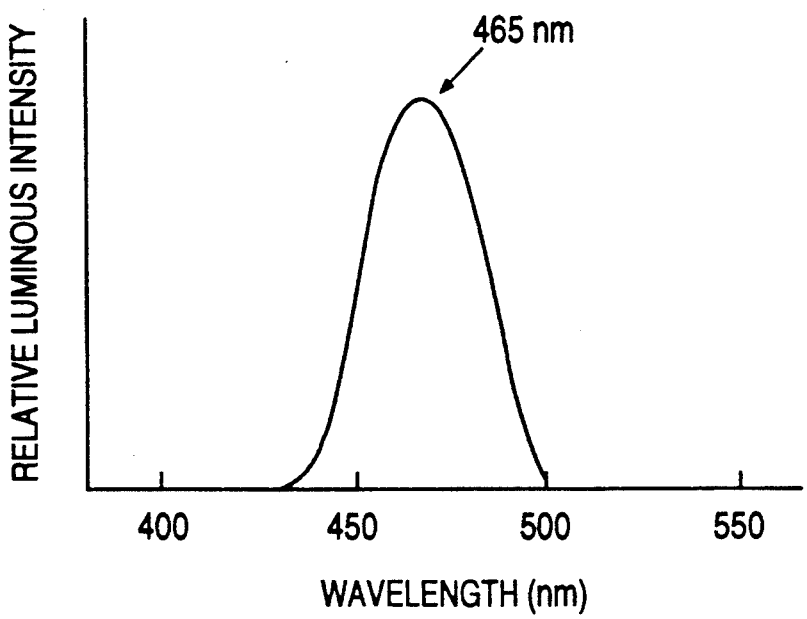
FIG. 8 is a graph illustrating the relation between the wavelength of the light emitting diode according to the invention and relative luminous intensity thereof.

Referring to FIG. 7, controlling the ratio of ratio of the current induced by electrons injected from the n-type SiC single-crystal layer 2 to the p-type SiC single-crystal layer 3 to the counterpart induced by holes injected from the p-type SiC single-crystal layer 3 to the n-type SiC single-crystal layer 2 within the scope of 0.1 to 1 generated an electroluminescence with a peak wavelength of 460 nm to 470 nm. When the peak wavelength exhibited 465 nm, an emission spectrum shown in FIG. 8 was given.

EMBODIMENT 4

Figure 6:
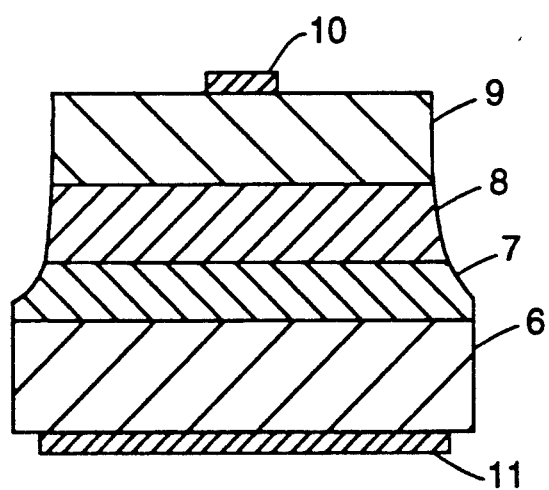
FIG. 6 is a view illustrating another embodiment of the pn junction type light emitting diode manufactured according to the invention.

Referring to FIG. 6, Embodiment 4 of the pn junction type light emitting diode comprises an n-type SiC single-crystal substrate 6, an n-type SiC single-crystal layer 7 (with a thickness of 2 $\mu$m) formed on the substrate 6, a p-type SiC single-crystal layer 8 (with a thickness of 2 $\mu$m) formed adjacent the n-type SiC single-crystal layer 7, a p-type SiC single-crystal layer 9 (with a thickness of 2 $\mu$m) formed on the p-type SiC single-crystal layer 8. A pn junction is formed between the n-type SiC single-crystal layer 7 and the p-type SiC single-crystal layer 8. The n-type SiC single-crystal layer 7 and the p-type SiC single-crystal layer 8 has a mesa construction. On the rear surface of the n-type SiC single-crystal substrate 6 a Ni-made ohmic electrode 11 was formed while on the p-type SiC single-crystal layer 9 an ohmic electrode 10 comprising a laminated layer of Ti and Al was formed.

Unlike Embodiment 3, Embodiment 4 comprised a p-type SiC single-crystal layer 9 formed on the p-type SiC single-crystal layer 8. As mentioned later, provision of the p-type SiC single-crystal layer 9 in the device allowed a sufficient diffusion of currents flowing from the ohmic electrode 10 to the p-type SiC single-crystal layer 8 within the low resistant p-type SiC single-crystal layer 9 so that current could flow uniformly in the pn junction portion.

The n-type SiC single-crystal layer 7 contained aluminum as an acceptor impurity and nitrogen as a donor impurity. The layer 7 had an electron concentration of $5 \times 10^{16}$ cm$^{-3}$.

The p-type SiC single-crystal layer 8 contained aluminum as impurity. The layer 8 had a hole concentration of $1 \times 10^{17}$ cm$^{-3}$.

The ratio of the electron concentration ($5 \times 10^{16}$ cm$^{-3}$) in the n-type SiC single-crystal layer 7 to the hole concentration ($1 \times 10^{17}$ cm$^{-3}$) in the p-type single-crystal layer 8 exhibited a value of 0.5.

The p-type SiC single-crystal layer 9 had a hole concentration of $1 \times 10^{19}$ cm$^{-3}$ so that the layer 9 could have a higher hole concentration than the p-type SiC single-crystal layer 8, which had a hole concentration of $1 \times 10^{17}$ cm$^{-3}$. Since the p-type SiC single-crystal layer 9 had a higher hole concentration than the p-type SiC single-crystal layer 8, the resistance of the p-type SiC single-crystal layer could be kept low. As will be detailed later, in operating the diode device, current sufficiently diffused from the ohmic electrode 10 to the p-type single-crystal layer 8 in the low resistant p-type SiC single-crystal layer 9, and flowed uniformly in the pn junction portion.

In the pn junction type light emitting diode according to the invention, after growing the n-type SiC single-crystal layer 7 on the n-type SiC single-crystal substrate 6 like Embodiment 3, the p-type SiC single-crystal layer 8 was grown on the n-type SiC single-crystal layer 7.

Further, while allowing carrier gas, material gas and impurity gas to flow through the device, the p-type SiC single-crystal layer 9 was grown on the p-type SiC single-crystal layer 8. As material gas, 1 cc/m of monosilane (SiH$_4$) gas and 1 cc/m of propane gas (C$_3$H$_8$) was used. As impurity gas, 0.05 to 0.5 cc/m of trimethylaluminum (Al(CH$_3$)$_3$) gas was used for doping aluminum acceptor.

After taking out this n-type SiC single-crystal substrate 6 from the gas phase growth system, the n-type SiC single-crystal layer 7, the p-type SiC single-crystal layer 8 and the p-type SiC single-crystal layer 9 were selectively etched like Embodiment 1. As a result of the etching process, the n-type SiC single-crystal layer 7, the n-type SiC single-crystal substrate comprising the p-type SiC single-crystal layer 8 formed adjacent the n-type SiC single-crystal layer 7 and the p-type SiC single-crystal layer 9 formed on the p-type SiC single-crystal layer 8 were given.

On the rear surface of the n-type SiC single-crystal substrate 6, an Ni-made ohmic electrode 11 was formed. Subsequently, on the p-type SiC single-crystal layer 9 an ohmic electrode 10 comprising a laminated layer of Ti and Al was formed.

Adjusting the value obtained by subtracting the hole concentration in the n-type SiC single-crystal layer 7 from the electron concentration in the same n-type SiC single-crystal layer 7 to the scope of $5 \times 10^{16}$ cm$^{-3}$ and adjusting the hole concentration in the p-type SiC single-crystal layer 8 to $1 \times 10^{17}$ cm$^{-3}$ allowed a ratio of the current induced by electrons injected from the n-type SiC single-crystal layer 7 to the p-type SiC single-crystal layer 8 to the current induced by holes injected from the p-type SiC single-crystal layer 8 to the n-type SiC single-crystal layer 3 in operating the diode to give a value of 1.

Since the p-type SiC single-crystal layer 9 was formed, in operating the diode, current sufficiently diffused from the ohmic electrode 10 to the p-type single-crystal layer 8 in the low resistant p-type SiC single-crystal layer 9, and flowed uniformly in the pn junction portion.

Applying an operating voltage of 3.2 V to the pn junction light emitting diode allowed current to pass through the diode at 20 mA and generated a blue light electroluminescence with a peak wavelength of 465 nm and luminance of 30 mcd, whereby the luminous efficiency is improved to give electroluminescence with luminance two times stronger than Embodiment 3.

EMBODIMENT 5

Embodiment 5 of the pn junction type light emitting diode comprised a n-type SiC single-crystal substrate, a n-type single-crystal layer (with a thickness of 2 μm) formed on the substrate, a p-type SiC single-crystal layer (with a thickness of 2 μm) formed adjacent the n-type SiC single-crystal layer. A pn junction was formed between the n-type SiC single-crystal layer and the p-type SiC single-crystal layer. The n-type SiC single-crystal layer and the p-type single-crystal layer had a mesa construction. On the rear surface of the n-type SiC single-crystal substrate a Ni-made ohmic electrode was formed while on the p-type SiC single-crystal layer an ohmic electrode comprising a laminated layer of Ti and Al was formed.

The n-type SiC single-crystal layer contained aluminum as an acceptor impurity and nitrogen as a donor impurity. The layer had an electron concentration of $5 \times 10^{16}$ cm$^{-3}$.

The p-type SiC single-crystal layer contained aluminum as an acceptor impurity. The layer had a hole concentration of $1 \times 10^{17}$ cm$^{-3}$. The ratio of the electron concentration in the n-type SiC single-crystal layer to the hole concentration in the p-type SiC single-crystal layer was 0.5.

In Embodiment 5, unlike Embodiment 3, the n-type SiC single-crystal substrate, the n-type SiC single-crystal layer and the p-type SiC single-crystal layer has a 15R-type polytype. (It has an energy band gap of about 3 eV.) Since the n-type SiC single-crystal substrate, the n-type SiC single-crystal layer, and the p-type SiC single-crystal layer had a 15R-type crystalline structure, a pn junction type light emitting diode with a peak wavelength of 460 to 470 nm could be manufactured in the same way with Embodiment 3.

Adjusting the value obtained by subtracting the hole concentration in the n-type SiC single-crystal layer from the electron concentration in the same n-type SiC single-crystal layer to the scope of $5 \times 10^{16}$ cm$^{-3}$ and adjusting the hole concentration in the p-type SiC single-crystal layer to $1 \times 10^{17}$ cm$^{-3}$ allowed a ratio of the current induced by electrons injected from the n-type SiC single-crystal layer to the n-type SiC single-crystal layer to the current induced by holes injected from the p-type SiC single-crystal layer to the n-type SiC single-crystal layer in operating the diode to give a value of 1.

Applying an operating voltage of 3.2 V to the pn junction light emitting diode allowed current to pass through the diode at 20 mA and generated a blue light electroluminescence with a peak wavelength of 465 nm and luminance of 30 mcd.

As explained above, Embodiments 3 to 5 of the pn junction type light emitting diode provides a favorable control of the peak wavelength of the blue light electroluminescence with good reproducibility owing to separate generation of electroluminescence in the p-type SiC single-crystal layer and the counterpart in the n-type SiC single-crystal layer. Besides, the device provides a blue light electroluminescence with a peak wavelength of 460 to 470 nm without reducing the luminous efficiency owing to the separate electroluminescence in the p-type SiC single-crystal layer and the counterpart in the n-type single-crystal layer.

REFERENCE EMBODIMENT 1

Figure 9:
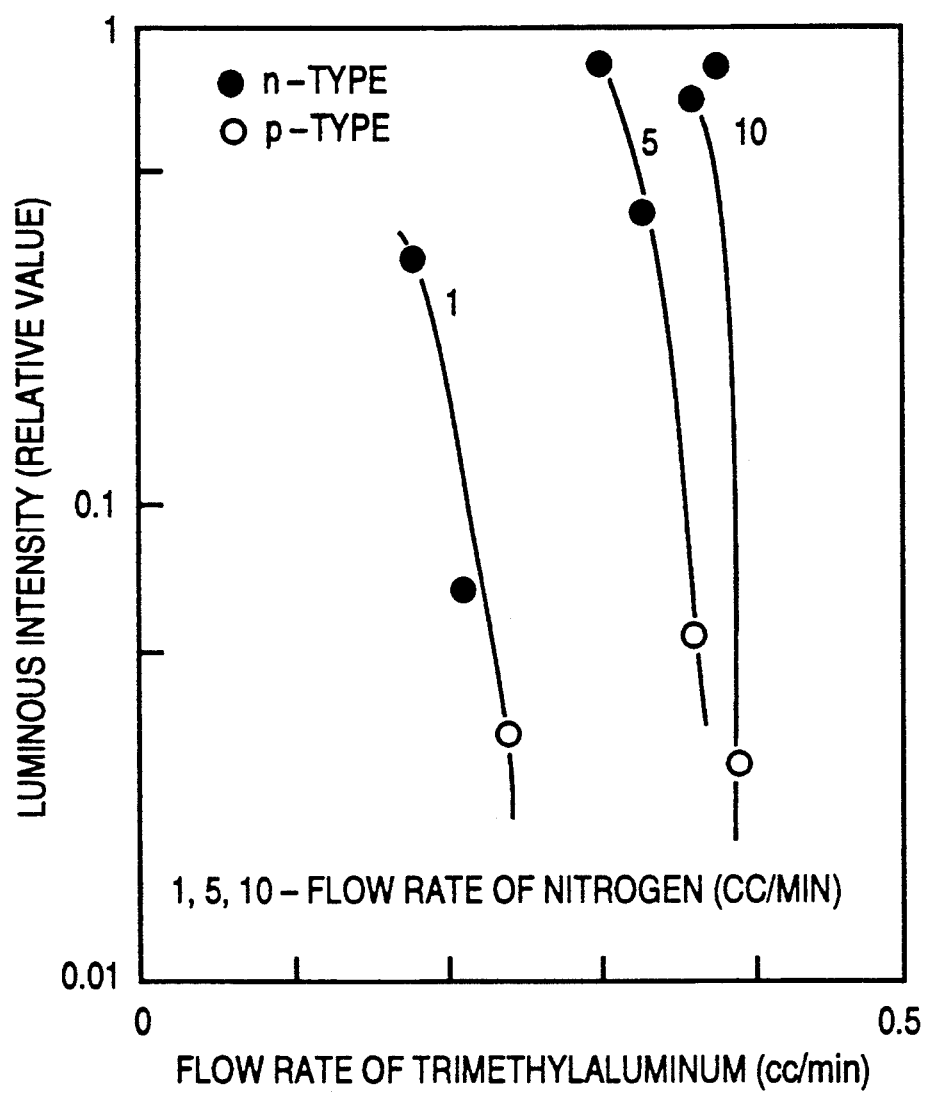
FIG. 9 is a graph showing the relation between the flow rate of trimethylaluminum in the process of manufacturing the pn junction type light emitting diode according to the invention and the luminous intensity thereof.

A 6H-SiC substantially (0001) Si surface provided a surface of a n-type SiC single-crystal substrate. On the substrate, a grown layer including both a nitrogen donor and an aluminum acceptor were formed with the CVD method. The ultraviolet light of a helium cadmium laser was irradiated and excited onto the grown layer, thereby measuring the photoluminescent intensity from the grown layer at room temperature. All the photoluminescences exhibited a peculiar spectrum at donor-acceptor paired electroluminescence between a nitrogen donor and an aluminum acceptor both having a luminescent peak wavelength of 460 to 480 nm. Nitrogen donor was doped into the grown layer by adding nitrogen gas with source gas and carrier gas in the growth process while an aluminum acceptor was doped into the grown layer by adding trimethylaluminum gas. The inventors of the invention measured the luminous intensity of the photoluminescence by changing the doping amount of the nitrogen donor and the trimethylaluminum gas. FIG. 9 shows the result of the measurements. When the grown layer constituted a p-type with an increase in the doping amount of trimethylaluminum gas, the luminous intensity decreased to one sixth or seventh or even one tenth.

Forming a pn junction structure including an n-type luminescent layer and a low-resistance current diffusion layer respectively compensated with an acceptor on the n-type SiC single-crystal layer having a substantially (0001) Si surface used in the invention provided a blue light emitting diode whose external luminous efficiency attained several percent.

REFERENCE EMBODIMENT 2

Figure 10:
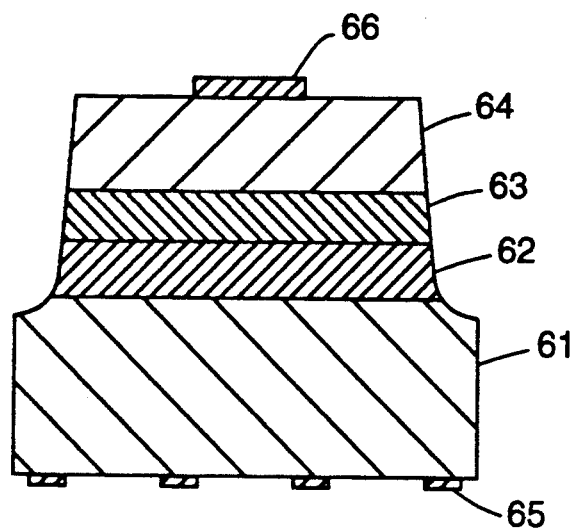
FIG. 10 is a view illustrating another embodiment of the pn junction type light emitting diode manufactured in an embodiment according to the invention.

FIG. 10 shows a sectional view illustrating the structure of a pn junction type light emitting diode according to Reference Embodiment 2 of the invention. This light emitting diode used a 6H-type SiC with a forbidden band gap of about 3.0 eV. On an n-type SiC single-crystal substrate 61 having a substantially (0001) Si surface, an n-type SiC single-crystal layer 62, a p-type SiC single-crystal layer 63, and a low resistance p-type SiC single-crystal layer 64 were sequentially formed. On the rear surface of the n-type SiC single-crystal substrate 61, an ohmic electrode 65 made of Ni was provided. On the other hand, on the surface of the low resistance p-type SiC single-crystal layer 64 an ohmic electrode 66 comprising a laminated layer of Ti and Al was provided.

A method for manufacturing the light emitting diode will be detailed below. A 6H-type n-type SiC single-crystal substrate 61 having a dimension of about 1 cm × 1 cm was used for the diode. A surface inclined by an angle of 2 to 15 degrees, preferably 5 degrees from the (0001) Si surface toward the <11$\bar{2}$0> direction was used as a growth surface of the substrate 61. While allowing hydrogen gas to flow into a reaction tube as carrier gas at a rate of 10 l/m, a high frequency current is charged to a work coil and the n-type SiC single-crystal substrate 61 was heated to 1400° to 1500° C. By adding source gas and impurity gas to the carrier gas while keeping the heating process, an n-type SiC single-crystal layer 62 with a thickness of 3 to 20 μm, preferably 5 to 15 μm was grown on the n-type SiC single-crystal substrate 61, and then a p-type SiC single-crystal layer 63 with a thickness of 1 to 20 μm, preferably 1 to 10 μm was also grown thereon to form a pn junction.

In Reference Embodiment 2, monosilane (SiH$_4$) gas and propane (C$_3$H$_8$) gas was used as source gas. The flow rate of each source gas was set at 1 cc/m. In growing an n-type SiC single-crystal layer 62, both nitrogen gas and an aluminum acceptor was doped with both nitrogen gas and trimethylaluminum gas. The flow rate of the doped gas was adjusted to provide an n-type grown layer. In Reference Embodiment 2, nitrogen gas was doped at a rate of 1 to 10 cc/m while trimethylaluminum gas was doped at a rate of 0.2 to 0.4 cc/m. The electron concentration of the n-type SiC single-crystal layer 62 was set at $5 \times 10^{15}$ to $5 \times 10^{17}$ cm$^{-3}$. On the other hand, in growing a p-type SiC single-crystal layer 63, trimethylaluminum gas was doped at a rate of 0.2 to 0.5 cc/m to form a p-type layer with a hole concentration of $1 \times 10^{17}$ to $1 \times 10^{18}$ cm$^{-3}$.

Subsequently, trimethylaluminum gas was doped at a rate of 0.5 to 0.8 cc/m to grow the p-type SiC single-crystal layer 64 having a resistivity of 0.01 to 1 Ω·cm to a thickness of 2 to 20 μm, preferably 5 to 15 μm into a current diffusion layer overlaying the p-type SiC single-crystal layer 63.

In the next process, the n-type SiC grown layer 62, the p-type SiC grown layer 63 and 64 were subjected to a selective etching process to form a mesa construction shown in FIG. 10.

In the last process, on the rear surface of the n-type SiC substrate 61, an ohmic electrode 65 made of Ni was provided while on the top surface of the low-resistance p-type another ohmic electrode 66 comprising a laminated layer of Ti and Al was provided. Then the layers thus formed were cut into a 300×300 μm square chip with a dicing to give a pn junction light emitting diode shown in FIG. 10.

Applying an operating voltage of about 3.0 eV allowed current to flow at 20 mA to emit blue light with a peak wavelength of about 465 nm. The diode exhibited an external quantum efficiency of 2% at most. As a comparative example, a blue light emitting diode with a structure using a donor-acceptor paired electroluminescence from the p-type SiC single-crystal layer 63 was manufactured by doping a nitrogen donor to the p-type SiC single-crystal layer 63 without adding an aluminum acceptor to the n-type SiC single-crystal layer 62. The external quantum efficiency of the electroluminescence exhibited 0.9%.

EMBODIMENT 6

Figure 11:
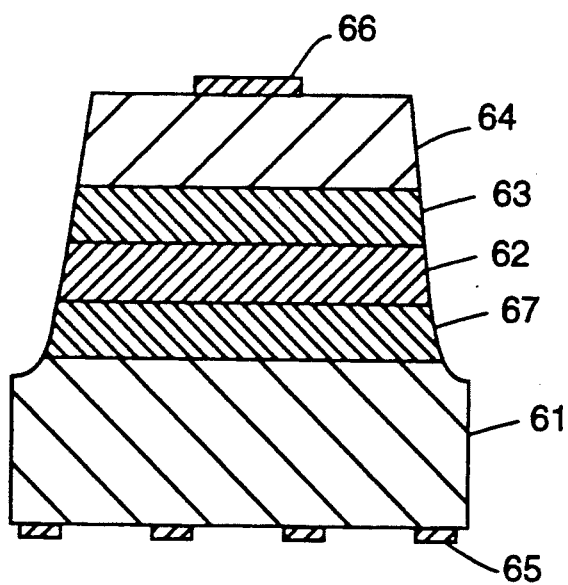
FIG. 11 is a view illustrating another embodiment of the pn junction type light emitting diode manufactured according to the invention.

FIG. 11 shows a sectional view of Embodiment 6 of the pn junction type light emitting diode according to this invention. Embodiment 6 of the light emitting diode was the same with Reference Embodiment 2 except that an n-type SiC single-crystal layer 67 without an acceptor was provided between the n-type SiC single-crystal substrate 61 and the n-type SiC single-crystal layer 60 compensated with an acceptor a n-type SiC single-crystal layer 62. Except for this, Embodiment 6 is the same with Reference Embodiment 2. The n-type SiC single-crystal layer 67 might be a impurity non-doped n-type layer intentionally without nitrogen gas, or a n-type layer doped with nitrogen gas at a rate of 0.05 to 0.2 cc/m and having an electron concentration of $1 \times 10^{17}$ to $1 \times 10^{18}$ cm$^{-3}$. It had a thickness of 1 to 20 μm, preferably a thickness of 5 to 15 μm. Adding a n-type SiC single-crystal layer 67 between the n-type SiC single-crystal substrate 61 and the n-type luminescent layer 62 reduced crystal defects transmitted from the substrate to give electroluminescence at an external quantum efficiency of 3% at most.

EMBODIMENT 7

Figure 12:
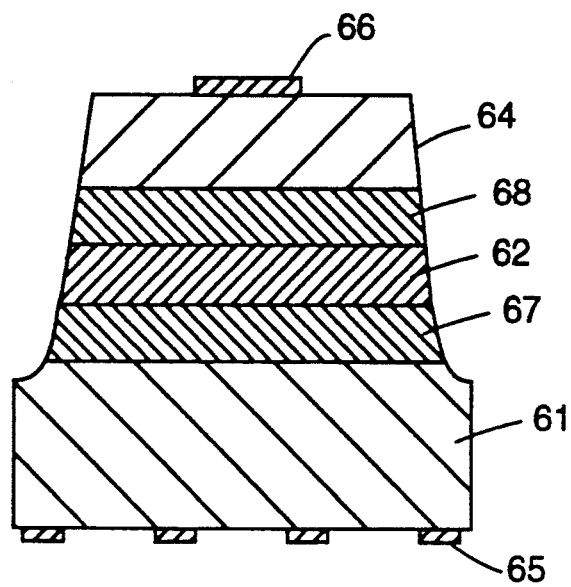
FIG. 12 is a view illustrating another embodiment of the pn junction type light emitting diode manufactured according to the invention.

FIG. 12 shows a sectional view of Embodiment 7 of the pn junction type light emitting diode according to the invention. Embodiment 7 of the light emitting diode was the same with Embodiment 8 except that a p-type SiC single-crystal layer 68 doped with nitrogen donor was used in the place of the p-type SiC single-crystal layer 63. In growing the p-type SiC single-crystal layer 68, trimethylaluminum gas was added at a rate of 0.2 to 0.5 cc/m and nitrogen gas at a rate of 0.05 to 0.2 cc/m was also added to give a p-type SiC single-crystal layer doped with nitrogen donor and an aluminum acceptor. The ratio of the electron concentration of the n-type SiC single-crystal layer to the p-type SiC single-crystal layer exhibited a value of 10 to 0.05. Consequently, the light emitting diode the light emitting diode exhibited an external quantum efficiency of 4% at most by the combination of n-type luminescent layer 62 and the donor-acceptor paired electroluminescence from the p-type layer 68.

EMBODIMENT 8

Figure 13:
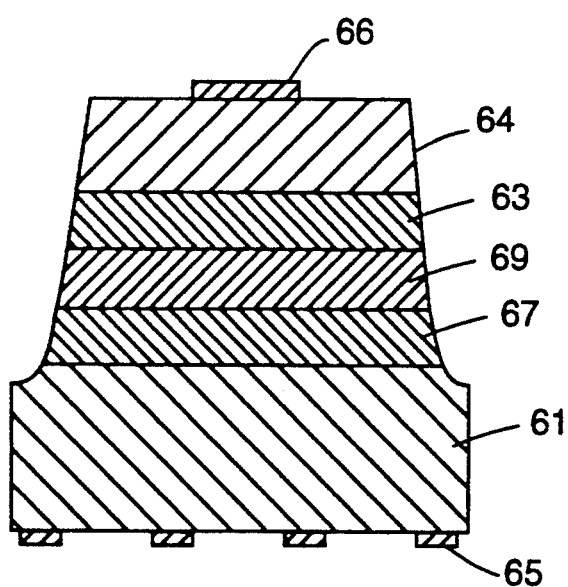
FIG. 13 is a view illustrating another embodiment of the pn junction type light emitting diode manufactured according to the invention.
Figure 14:
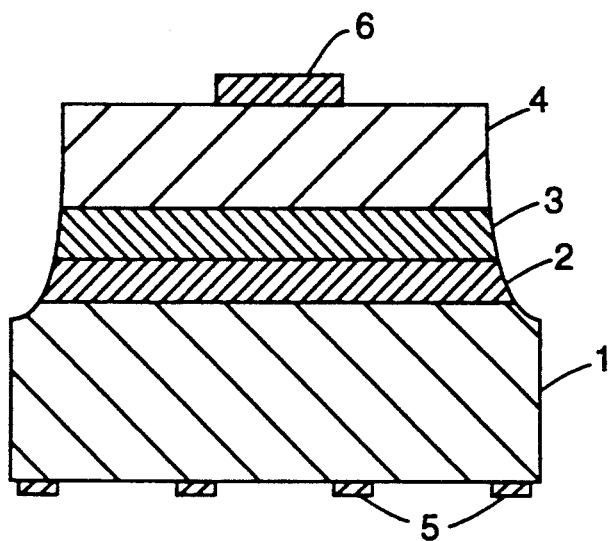
FIG. 14 is a view illustrating another embodiment of the pn junction type light emitting diode manufactured according to the invention.
Figure 15:
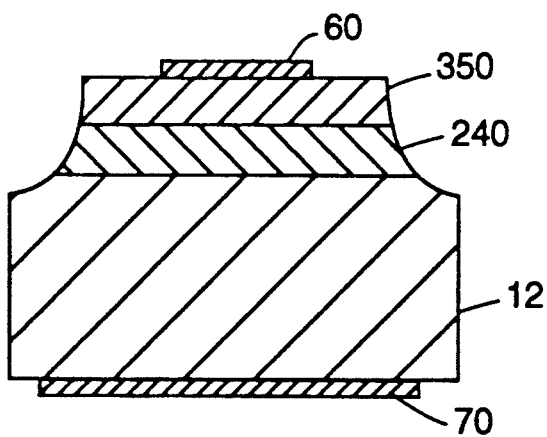
FIG. 15 is a view illustrating a conventional counterpart of a pn junction type light emitting diode.

FIG. 13 shows a sectional view of Embodiment 8 of the pn junction type light emitting diode according to the invention. Embodiment 8 of the light emitting diode was the same with Embodiment 6 shown in FIG. 11 except that a 4H-type SiC single-crystal layer was used in the place of the 6H-type SiC single-crystal layer and that a n-type SiC single-crystal layer 69 doped with aluminum acceptor was used.

A 4H-type SiC single-crystal layer had a band gap of 3.2 eV, which was a little larger than a band gap of a 6H-type SiC single-crystal layer. The crystal of the 4H-type SiC layer could be grown in the same manner with the 6H-type. The wider band gap caused paired electroluminescence between the nitrogen donor and the aluminum acceptor to exhibit a violet color with a peak wavelength of about 420 nm with reduced luminance.

With the adoption of gallium acceptor, which had a deeper energy level than aluminum counterpart, paired electroluminescence between the nitrogen donor and the gallium acceptor provides a blue electroluminescence with a peak wavelength of about 450 nm.

In growing the n-type SiC single-crystal layer 69 doped with a gallium acceptor, trimethylgallium gas was added at a rate of 0.2 to 0.4 cc/m in addition to nitrogen gas added at a rate of 1 to 10 cc/m. The electron concentration of the n-type SiC single-crystal layer 69 was set at $5 \times 10^{15}$ to $5 \times 10^{17}$ cm$^{-3}$.

Applying an operating voltage of about 3.2 eV allowed current to flow at 20 mA to emit blue light with a peak wavelength of about 450 nm. The external quantum efficiency was 4% at most.

EMBODIMENT 9

Embodiment 9 of the pn junction type light emitting diode according to the invention is the same with Embodiment 6 except that a 15 R-type SiC was used in the place of a 6H-type SiC. The 15R-type SiC had almost the same band gap with the 6H-type SiC. A pn junction type diode was manufactured in the same way with Embodiment 6, and it had a peak wavelength of about 470 nm and an external quantum efficiency of 2% at maximum.

What is claimed is:

1. A pn type SiC light emitting diode comprising:
   an n-type SiC single-crystal substrate provided with an ohmic electrode on a rear surface thereof, the substrate having an electron concentration;
   a first n-type SiC single-crystal layer overlaying said substrate;
   a second n-type SiC single-crystal layer overlaying said first n-type SiC single-crystal layer; and
   a first p-type SiC single-crystal layer overlaying said second n-type layer;
   said second n-type SiC single-crystal layer and said first p-type SiC layer being combined to form a pn junction layer;
   said first n-type SiC layer having an electron concentration larger than $1 \times 10^{15}$ cm$^{-3}$ and smaller than the electron concentration of said substrate, said first n-type SiC single-crystal layer having a thickness of 0.1 to 20 $\mu$m;
   wherein said n-type SiC single-crystal substrate has (0001) Si surface and is inclined by an angle of 2 to 15 degrees from the (0001) Si surface in the $<11\bar{2}0>$ direction.

2. The light emitting diode of claim 1, wherein said n-type SiC single-crystal substrate is of one hexagonal polytype selected from a group of 6H, 4H and 15R.

3. The light emitting diode of claim 1, wherein said second n-type SiC single-crystal layer contains an acceptor.

4. The light emitting diode of claim 3 wherein said acceptor is made of aluminum or gallium.

5. The light emitting diode of claim 1, wherein said second n-type SiC single-crystal layer contains a nitrogen donor.

6. The light emitting diode of claim 1 wherein said first n-type SiC layer has an electron concentration in the range of $1 \times 10^{15}$ cm$^{-3}$ to $5 \times 10^{17}$ cm$^{-3}$.

7. A pn type SiC light emitting diode comprising:
   an n-type SiC single-crystal substrate provided with an ohmic electrode on a rear surface thereof, the substrate having an electron concentration;
   a first n-type SiC single-crystal layer overlaying said substrate;
   a second n-type SiC single-crystal layer overlaying said first n-type SiC single-crystal layer; and
   a first p-type SiC single-crystal layer overlaying said second n-type layer;
   said second n-type SiC single-crystal layer and said first p-type SiC layer being combined to form a pn junction layer;
   said first n-type SiC layer having an electron concentration larger than $1 \times 10^{15}$ cm$^{-3}$ and smaller than the electron concentration of said substrate, said first n-type SiC single-crystal layer having a thickness of 0.1 to 20 $\mu$m;
   wherein said first p-type SiC single-crystal layer contains an aluminum acceptor and the ratio of an electron concentration in the second n-type SiC single-crystal layer to a hole concentration in the first p-type SiC single-crystal layer is in the range of 0.05 to 5.

8. The light emitting diode of claim 7, wherein said n-type SiC single-crystal substrate is of a hexagonal polytype selected from a group of 6H, 4H and 15R.

9. The light emitting diode of claim 7, wherein said second n-type SiC single-crystal layer contains an acceptor.

10. The light emitting diode of claim 9 wherein said acceptor is made of aluminum or gallium.

11. The light emitting diode of claim 7, wherein said second n-type SiC single-crystal layer contains a nitrogen donor.

12. A pn type SiC light emitting diode comprising:
    an n-type SiC single-crystal substrate provided with an ohmic electrode on a rear surface thereof, the substrate having an electron concentration;
    a first n-type SiC single-crystal layer overlaying said substrate;
    a second n-type SiC single-crystal layer overlaying said first n-type SiC single-crystal layer; and
    a first p-type SiC single-crystal layer overlaying said second n-type layer;
    said second n-type SiC single-crystal layer and said first p-type SiC layer being combined to form a pn junction layer;
    said first n-type SiC layer having an electron concentration larger than $1 \times 10^{15}$ cm$^{-3}$ and smaller than the electron concentration of said substrate, said first n-type SiC single-crystal layer having a thickness of 0.1 to 20 $\mu$m;
    wherein said first p-type SiC single-crystal layer contains both an aluminum acceptor and a nitrogen donor, and the ratio of an electron concentration in said second n-type SiC single-crystal layer to a hole concentration in the first p-type SiC single-crystal layer is in the range of 0.05 to 10.

13. The light emitting diode of claim 12, wherein said n-type SiC single-crystal substrate is of a hexagonal polytype selected from a group of 6H, 4H and 15R.

14. The light emitting diode of claim 12, wherein said second n-type SiC single-crystal layer contains an acceptor.

15. The light emitting diode of claim 14 wherein said acceptor is made of aluminum or gallium.

16. The light emitting diode of claim 12, wherein said second n-type SiC single-crystal layer contains a nitrogen donor.

17. A pn type SiC light emitting diode comprising:
    an n-type SiC single-crystal substrate provided with an ohmic electrode on a rear surface thereof, the substrate having an electron concentration;
    a first n-type SiC single-crystal layer overlaying said substrate;
    a second n-type SiC single-crystal layer overlaying said first n-type SiC single-crystal layer; and
    a first p-type SiC single-crystal layer overlaying said second n-type layer;
    said second n-type SiC single-crystal layer and said first p-type SiC layer being combined to form a pn junction layer;
    said first n-type SiC layer having an electron concentration larger than $1 \times 10^{15}$ cm$^{-3}$ and smaller than the electron concentration of said substrate, said first n-type SiC single-crystal layer having a thickness of 0.1 to 20 $\mu$m;
    wherein a second p-type SiC single-crystal layer and an ohmic electrode are further provided over said first p-type SiC single-crystal layer, said second p-type SiC single-crystal serving as a current diffusion layer whose resistivity exhibits a value of not more than 1$\Omega$·cm.

18. The light emitting diode of claim 17 wherein said second p-type single-crystal layer has a thickness of 2 to 15 μm.

19. The light emitting diode of claim 17, wherein said n-type SiC single-crystal substrate is of a hexagonal polytype selected from a group of 6H, 4H and 15R.

20. The light emitting diode of claim 17, wherein said second n-type SiC single-crystal layer contains an acceptor.

21. The light emitting diode of claim 20 wherein said acceptor is made of aluminum or gallium.

22. The light emitting diode of claim 17, wherein said second n-type SiC single-crystal layer contains a nitrogen donor.

* * * * *